United States Patent
Song et al.

(10) Patent No.: US 6,456,538 B1
(45) Date of Patent: Sep. 24, 2002

(54) NONVOLATILE MEMORY, SYSTEM HAVING NONVOLATILE MEMORIES, AND DATA READ METHOD OF THE SYSTEM

(75) Inventors: Seung-Taek Song; Young-Joon Choi, both of Kyungki-do (KR)

(73) Assignee: Samsung Electronics Co, Ltd., Suwon (KR)

( * ) Notice: Subject to any disclaimer, the term of this patent is extended or adjusted under 35 U.S.C. 154(b) by 0 days.

(21) Appl. No.: 09/916,735

(22) Filed: Jul. 26, 2001

(30) Foreign Application Priority Data

Aug. 8, 2000 (KR) .............................................. 00-45998

(51) Int. Cl.⁷ .............................................. G11C 16/04
(52) U.S. Cl. ............................ 365/189.01; 365/189.05; 365/230.08
(58) Field of Search ........................ 365/189.01, 189.05, 365/230.08, 230.01, 189.09, 230.03, 241, 236

(56) References Cited

U.S. PATENT DOCUMENTS 5,392,239 A * 2/1995 Margulis et al. ........ 365/189.01

* cited by examiner

*Primary Examiner*—David Lam
(74) *Attorney, Agent, or Firm*—Marger Johnson & McCollom, P.C.

(57) ABSTRACT

A plurality of nonvolatile memories are adapted to generate ready/busy signals and internal inverted chip enable signals. A controller outputs to the memories an external inverted chip enable signal, an inverted write enable signal, an inverted read enable signal, an address, and data, and inputs the ready/busy signals outputted from the nonvolatile memories. Each of the nonvolatile memories includes a circuit that generates a first read "don't care" signal during a disable interval of an inverted write enable signal and a disable interval of an inverted read enable signal when a read command is applied during a read operation, and a second circuit that generates a second read "don't care" signal that is enabled by detecting an address input end, and disabled by detecting a ready state of a ready/busy signal when the read command is applied during the read operation. The memory also includes a circuit for enabling the internal inverted chip enable signal when at least one of the first and the second read "don't care" signals is generated, regardless of a logic state of an external inverted chip enable signal.

12 Claims, 11 Drawing Sheets

Fig. 4
(Related Art)
CLE 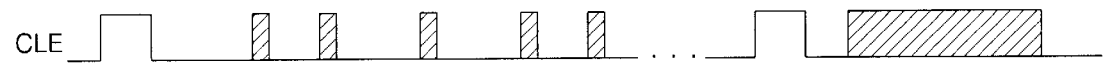
CEB 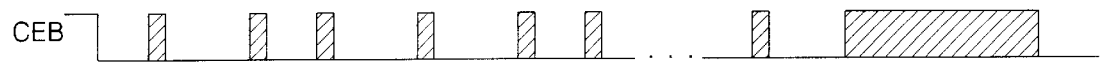
WEB 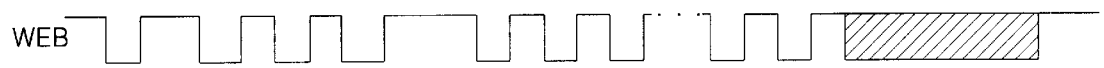
ALE 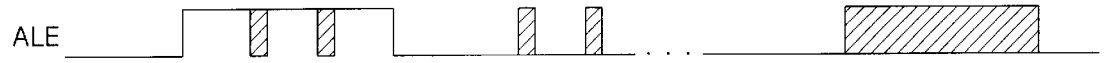
REB 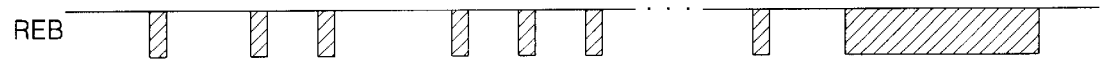
RBB 
tPROG
IO 0~7 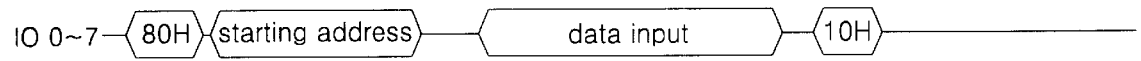

NONVOLATILE MEMORY, SYSTEM HAVING NONVOLATILE MEMORIES, AND DATA READ METHOD OF THE SYSTEM

CROSS REFERENCE TO RELATED APPLICATIONS

This application claims, under 35 U.S.C. §119, the benefit of Korean Patent Application No. 2000-45998, filed on Aug. 8, 2000, the entirety of which is hereby incorporated by reference.

BACKGROUND OF THE INVENTION

1. Field of the Invention

The present invention relates to a nonvolatile memory and a system having nonvolatile memories, and more particularly, to a nonvolatile memory, a system having nonvolatile memories, and a data read method of the system that performs a data read operation by interleaving consecutively a plurality of the nonvolatile memories.

2. Description of Related Art

In general, systems having a plurality of memories include a controller to control its operation. However, since such systems use common signal lines to transmit data between the memories and the controller, it is very important in system performance to interleave operation of many memories.

Conventional systems having a plurality of the nonvolatile memories can interleave a plurality of the nonvolatile memories by having a "don't care" interval during a write or an erase operation. During a read operation, however, it is impossible to interleave a plurality of the nonvolatile memories.

FIG. 1 is a block diagram illustrating a system having a plurality of the nonvolatile memories according to the prior art. As shown in FIG. 1, the system includes a controller 10 and a plurality of nonvolatile memories 20-1 to 20-n. Control signals CLE, ALE, WEB and REB are transmitted from the controller 10 to the nonvolatile memories 20-1 to 20-n through control signal lines 30. Inverted chip enable signals CEB1 to CEBn are transmitted from the controller 10 to the nonvolatile memories 20-1 to 20-n through inverted chip enable signal lines 32. Ready/busy signals RBB1 to RBBn are transmitted from the controller 10 to the nonvolatile memories 20-1 to 20-n through ready/busy signal lines 34. Input/output data IO0 to IOn are transmitted from the controller 10 to the nonvolatile memories 20-1 to 20-n through data input/output lines 36.

The signal CLE is a command latch enable signal that discriminates whether the inputted data are a command. The signal ALE is an address latch enable signal ALE that discriminates whether the inputted data are an address. The signal WEB is an inverted write enable signal that latches all inputted data that are written ( whether a command, an address, or the like). The signals CEB1 to CEBn are inverted chip enable signals that enable a plurality (n in number) of the nonvolatile memories 20-1 to 20-n. The signal REB is a read enable signal that enables a read operation. The signals IO1 to IOn are data that are inputted/outputted to/from the nonvolatile memories 20-1 to 20-n. The signals RBB1 to RBBn are ready/busy signals that indicate internal operation state of the nonvolatile memories 20-1 to 20-n.

FIG. 2 is a block diagram illustrating a configuration of an embodiment of the nonvolatile memory 20-1 of FIG. 1. As shown in FIG. 2, the nonvolatile memory 20-1 includes a memory cell array 40, a row decoder 42, a column decoder 44, a control signal generating circuit 46, a page buffer 48, a data input/output gate 50, and a data input/output buffer 52. The memory cell array 40 includes a plurality of memory cells (not shown) for storing data.

An operation of the nonvolatile memory 20-1 is explained below in detail. The row decoder 42 decodes a row address X, operating under the control of the control signal generating circuit 46. This selects a plurality of word lines (not shown) of the memory cell array 40.

The column decoder 44 decodes a column address Y, operating under the control of the control signal generating circuit 46, and selects the data input/output gate 50. The page buffer 48 stores byte data by one page size, in response to output signals from the column decoder 44

The byte data are inputted through the data input/output gate 50 during the write operation and that are outputted from the memory cell array 40 during the read operation. The data input/output gate 50 transmits data of one page size in byte unit to the data input/output buffer 52 in response to output signals from the column decoder 44. The data input/output buffer 52 buffers data of one page size that are inputted from an external portion, operating under the control of the control signal generating circuit 46, and then outputs to the data input/output gate 50 during the write operation. The data input/output buffer 52 buffers byte data outputted from the data input/output gate 50, outputs the byte data to an external portion during the read operation.

During the write operation, the nonvolatile memory 20-1 stores data of one page size in byte unit inputted from an external portion in the page buffer 48. Then data of one page size stored in the page buffer 48 are transferred to the memory cell array 40.

Conversely during the read operation, data of one page size that are stored in the memory cell array 40 are transferred to the page buffer 48. Then, data of one page size stored in the page buffer 48 are outputted in byte unit through the data input/output gate 50 and the data input/output buffer 52.

That is, the nonvolatile memory 20-1 transfers data to the memory cell array 40, or transfers data to the external portion through the data input/output gate 50 and the data input/output buffer 52. In the process, data become stored in the page buffer 48.

The nonvolatile memory 20-1 generates the ready/busy signal RBB having a logic "high" level when control signals, an address and data are inputted from an external portion. Further, the nonvolatile memory 20-1 generates the ready/busy signal RBB having a logic "low" level when performing an operation for reading data from the memory cell array 40 to the page buffer 48, and also when performing an operation for write and erase data from the page buffer 48 to the memory cell array 40.

FIG. 3 is a block diagram illustrating an internal inverted chip enable signal generating circuit 59 in the nonvolatile memory 20-1 according to the prior art. Circuit 59 includes a CEB buffer 60, a WEB disable detecting circuit 62, a REB disable detecting circuit 64, a program command detecting circuit 66, an erasing command detecting circuit 68, a read command detecting circuit 70, a PGM DNT signal generating circuit 72, a ERS DNT signal generating circuit 74, a RD DNT signal generating circuit 76, a RBB busy detecting circuit 78, a NOR gate NOR1, a NAND gate NAND1, and an inverter I1.

An operation of the inverted chip enable signal generating circuit is explained below in detail. The CEB buffer 60 buffers the external inverted chip enable signal CEB that is applied from an external portion, and then outputs it. The WEB disable detecting circuit 62 detects a transition of an inverted write enable signal WEB to a logic "high" level, and then generates the WEB disable detecting signal. The REB disable detecting circuit 64 detects a transition of the inverted read enable signal REB to a logic "high" level, and then generates the REB disable detecting signal. The program command detecting circuit 66 generates a program command detecting signal when a program command 80H is applied. The erase command detecting circuit 68 generates an erase command detecting signal when an erase command 60H is applied. The read command detecting circuit 70 generates a read command detecting signal when read commands 00H, 01H and 50H are applied. The RBB busy detecting circuit 78 detects a busy state of the ready/busy signal RBB and generates a RBB busy detecting signal.

In addition, the PGM DNT signal generating circuit 72 generates a program "don't care" signal PGM DNT having a logic "high" level when the program command detecting signal and the WEB disable detecting signal are generated. The ERS DNT signal generating circuit 74 generates an erasing "don't care" signal ERS DNT having a logic "high" level when the erase command detecting signal and the WEB disable detecting signal are generated.

The RD DNT signal generating circuit 76 generates a read "don't care" signal RD DNT having a logic "high" level when the read command detecting signal, the WEB disable detecting signal and the REB disable detecting signal are generated. Further, the RD DNT signal generating circuit 76 generates the read "don't care" signal RD DNT having a logic "low" level when the RBB busy detecting signal is generated.

The NOR gate NOR1 generates a signal having a logic "low" level when at least one of the program "don't care" signal PGM DNT, the erase "don't care" signal ERS DNT, and the read "don't care" signal RD DNT has a logic "high" level.

The NAND gate NAND1 and the inverter I1 generate the internal inverted chip enable signal CEiB having a logic "low" level in response to a signal having a logic "low" signal that is outputted from the NOR gate NOR1.

In other words, when at least one of the program "don't care" signal PGM DNT, the erasing "don't care" signal ERS DNT, and the read "don't care" signal RD DNT has a logic "high" level, the internal inverted chip enable signal CEiB having a logic "low" level signal is generated. That is regardless of the state of the applied external inverted chip enable signal CEB.

FIG. 4 is a timing diagram illustrating a write operation of the nonvolatile memory 20-1 according to the prior art. In FIG. 4, hatched portions denote the "don't care" intervals.

The nonvolatile memory 20-1 is enabled to operate in response to the external inverted chip enable signal CEB having a logic "low" level. The write command 80H, a starting address, and data are inputted in response to the control signals CLE, WEB and ALE that are applied from an external portion. At this time, the external inverted chip enable signal CEB can enter a "don't care" state during a logic "high" level of the inverted write enable signal WEB by the internal inverted chip enable signal generating circuit of FIG. 3. That is, the nonvolatile memory 20-1 can perform its internal operation independently of the state of the external inverted chip enable signal CEB.

When inputting data is completed, a write starting command 10H is applied from an external portion. The nonvolatile memory 20-1 generates the ready/busy signal RBB having a logic "low" level during a busy period tPROG of a write operation. At this time, the external inverted chip enable signal CEB can enter a "don't care" state during a logic "high" level of the inverted write enable signal WEB by the internal inverted chip enable signal generating circuit of FIG. 3. That is, the nonvolatile memory 20-1 can perform its internal operation during a busy period tPROG independently of the external inverted chip enable signal CEB. Therefore, the controller 10 of FIG. 1 can operate other ones of the nonvolatile memories of the chip, even during the busy period tPROG in which the nonvolatile memory 20-1 performs an internal write operation. Even though not shown, it is possible to operate a plurality of the nonvolatile memories even during an erase operation.

FIG. 5 is a timing diagram illustrating a read operation of the nonvolatile memory 20-1 of FIG. 1 according to the prior art. Hatched portions denote the "don't care" intervals.

The nonvolatile memory 20-1 is enabled to operate in response to the external inverted chip enable signal CEB having a logic "low" level. The read command 00H and a starting address are inputted in response to the control signals CLE, WEB and ALE that are applied from an external portion. At this time, the external inverted chip enable signal CEB can enter a "don't care" state during a logic "high" level of the inverted write enable signal WEB by the internal inverted chip enable signal generating circuit of FIG. 3.

When an input of the starting address is completed, the nonvolatile memory 20-1 generates the ready/busy signal RBB having a logic "low" level during a busy period tR of a read operation. At this time, the output inverted chip enable signal CEiB can not enter a "don't care" state during a busy period tR of a read operation by the internal inverted chip enable signal generating circuit 59 of FIG. 3.

This, therefore, is the problem in the prior art, which needlessly slows down the nonvolatile memory chip. The controller 10 of FIG. 1 can not operate any of the other nonvolatile memories in the chip while the nonvolatile memory 20-1 performs an internal read operation (during the busy period tR).

This especially occurs when a sequential read operation and a CEB intercept operation of the nonvolatile memory are performed in the prior art. The sequential read operation is one in which a read operation is performed with sequentially increasing a page from a page corresponding to the starting address, even though a read command and the starting address are inputted only once. The CEB intercept operation is one which disables an operation of the nonvolatile memory by keeping the inverted chip enable signal CEB in the state of a logic "high" level during a predetermined interval of a busy period tR. When that happens, the nonvolatile memory according to the prior art cannot enter a "don't care" state that is regardless of the inverted chip enable signal CEB during a busy period of a read operation.

SUMMARY OF THE INVENTION

It is an object of the present invention to provide a nonvolatile memory in which an inverted chip enable signal can enter a "don't care" state during a first busy period of a read operation.

It is another object of the present invention to provide a system having a plurality of nonvolatile memories that can perform a read operation by interleaving a plurality of the nonvolatile memories.

It is a still further object of the present invention to provide a data read method of the system having a plurality of the nonvolatile memories.

In order to achieve the above object, one of the preferred embodiments of the present invention provides a nonvolatile memory that is adapted to receive an external inverted chip enable signal, and to generate an internal inverted chip enable signal. The memory includes a circuit that generates a first read "don't care" signal during a disable interval of an inverted write enable signal and a disable interval of an inverted read enable signal when a read command is applied during a read operation, and a second circuit that generates a second read "don't care" signal that is enabled by detecting an address input end, and disabled by detecting a ready state of a ready/busy signal when the read command is applied during the read operation. The memory also includes a circuit for enabling the internal inverted chip enable signal when at least one of the first and the second read "don't care" signals is generated, regardless of a logic state of the external inverted chip enable signal.

The invention also provides a method. The invention enables better use of a group of memories by not disabling some of them unnecessarily. This and other features and advantages of the invention will be better understood in view of the accompanying description and detailed drawings.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which:

FIG. 4 is a timing diagram illustrating a write operation of the nonvolatile memory 20-1, when controlled by the circuit of FIG. 3;

DETAILED DESCRIPTION OF PREFFERED EMBODIMENTS

Reference will now be made in detail to preferred embodiments of the present invention, examples of which are illustrated in the accompanying drawings.

Figure 2:
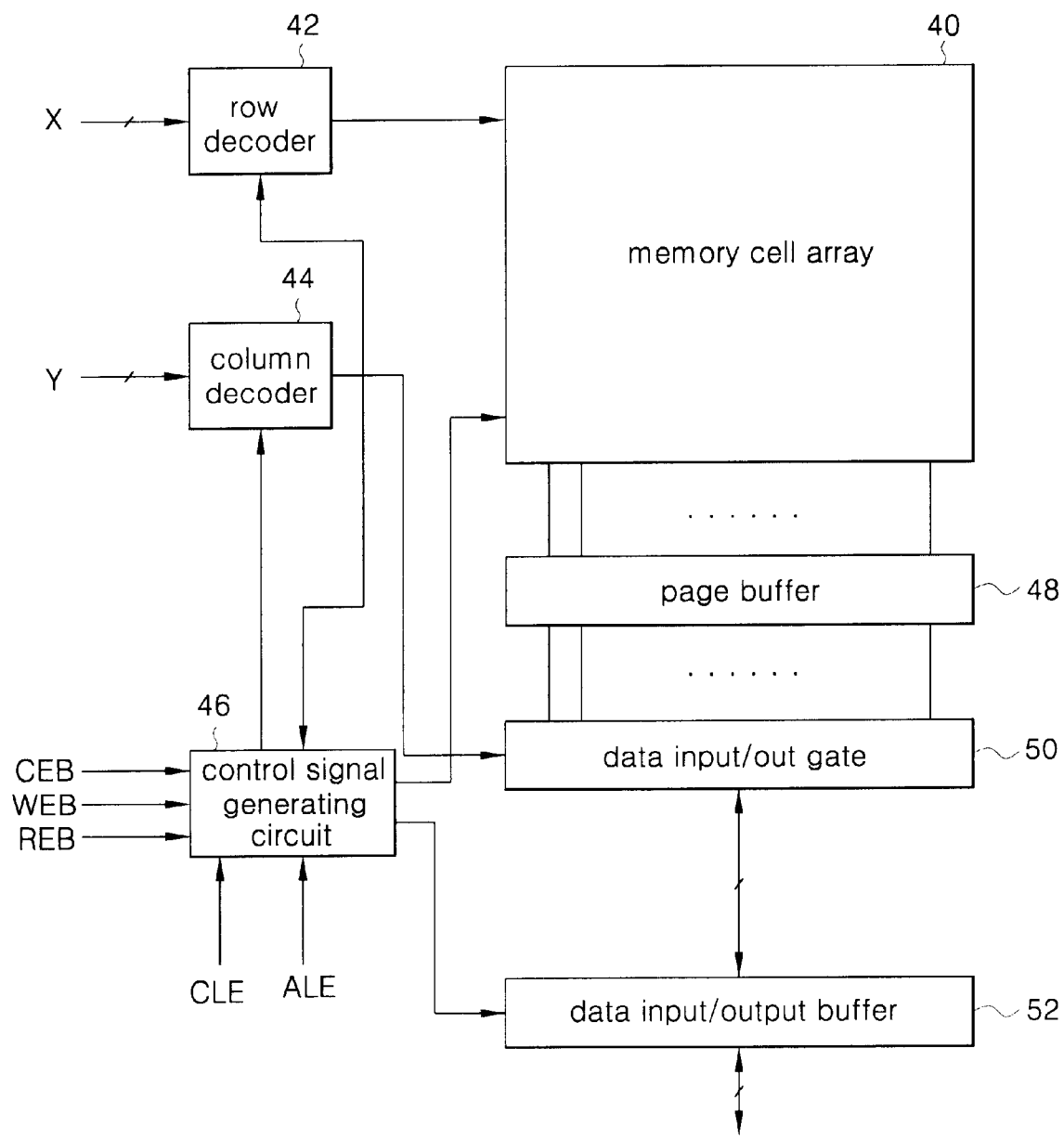
FIG. 2 is a block diagram illustrating a configuration of an embodiment of the nonvolatile memory 20-1 of FIG. 1.
Figure 6:
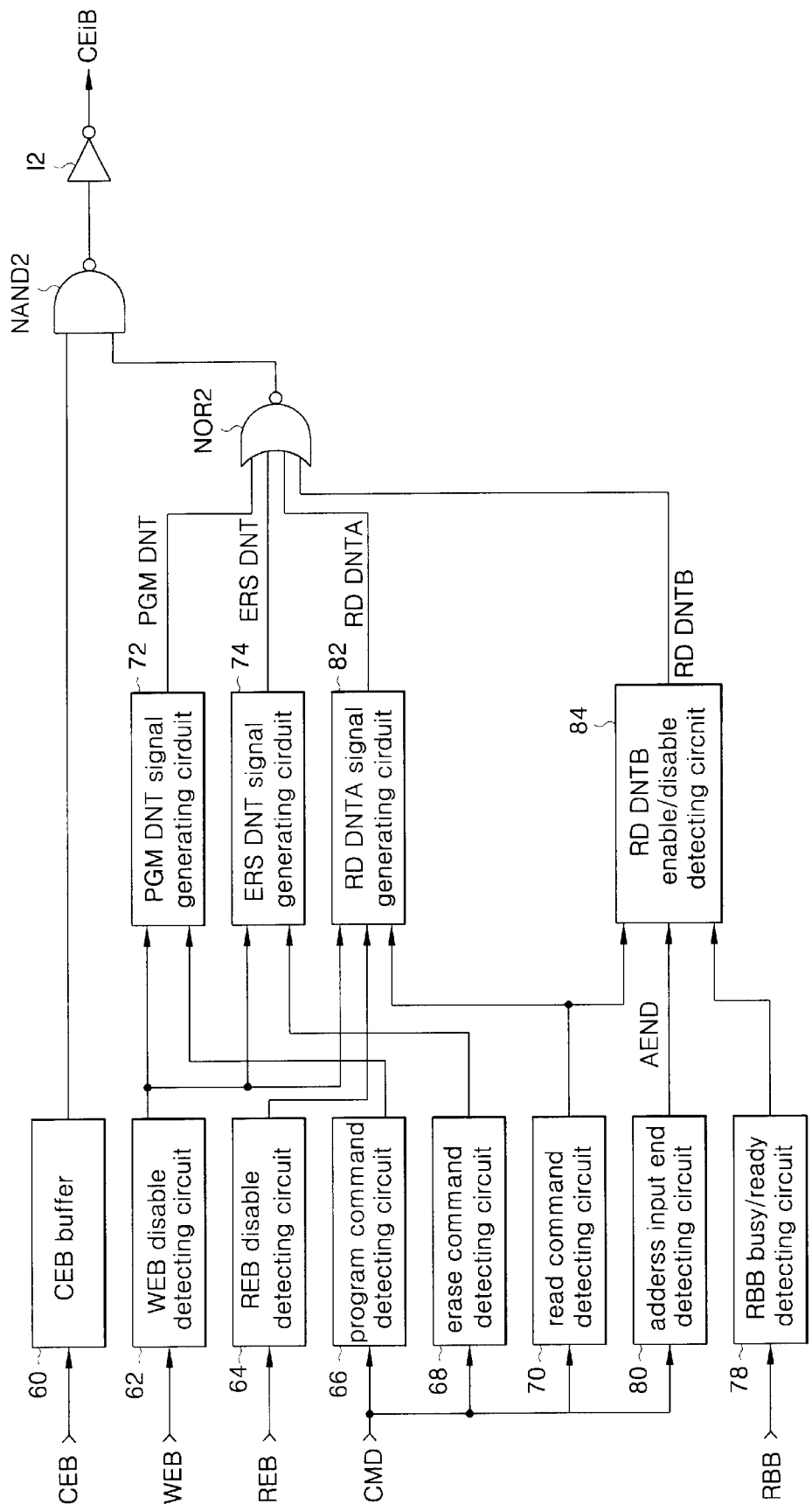
FIG. 6 is a block diagram illustrating an internal inverted chip enable signal generating circuit of a nonvolatile memory according to a preferred embodiment of the present invention.

FIG. 6 is a block diagram illustrating a configuration of an embodiment of an internal inverted chip enable signal generating circuit 79 of a nonvolatile memory according to a preferred embodiment of the present invention. Circuit 79 may be used in memory 20-1 of FIG. 2.

Figure 3:
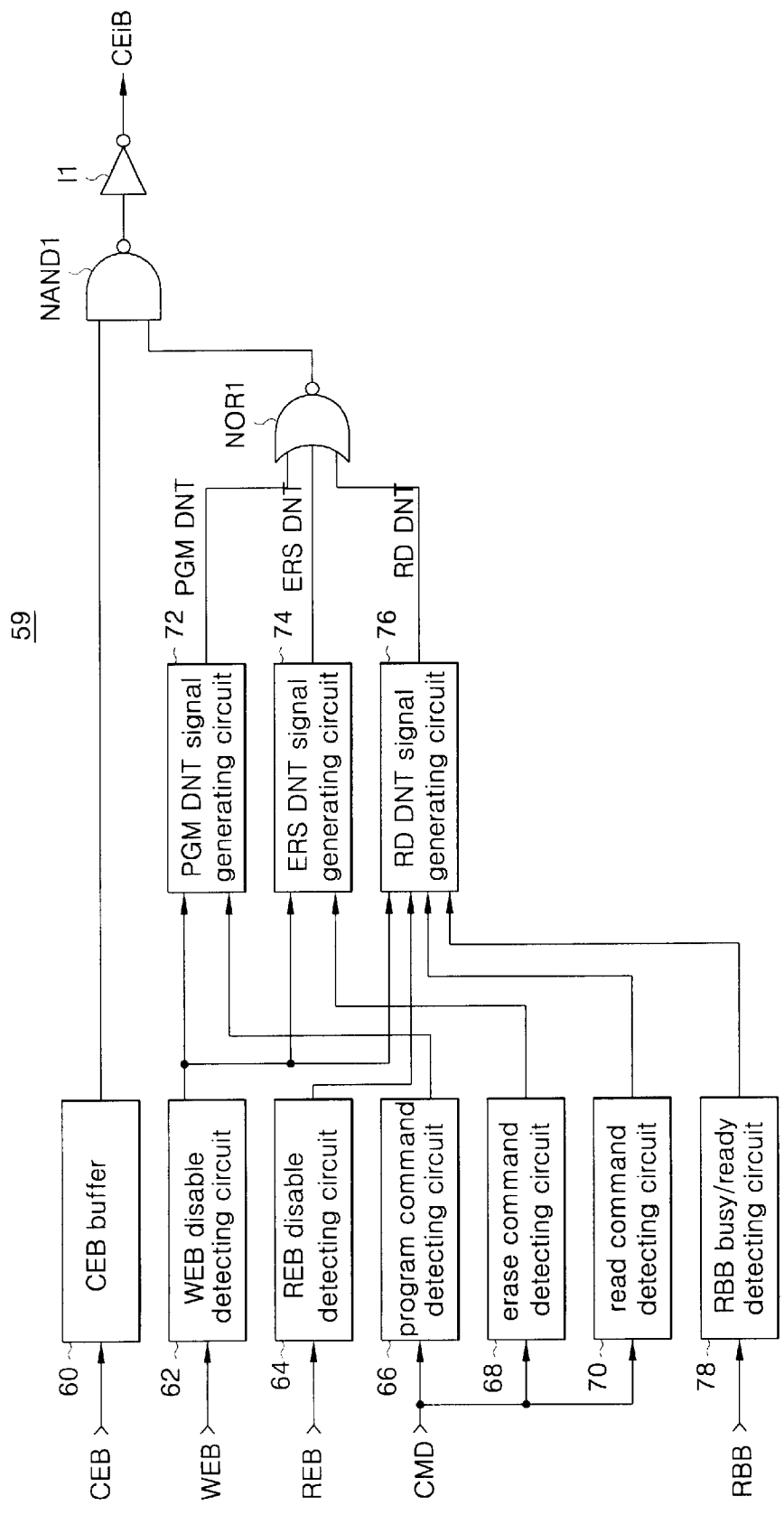
FIG. 3 is a block diagram illustrating an internal inverted chip enable signal generating circuit in the nonvolatile memory 20-1 according to the prior art.
Figure 5:
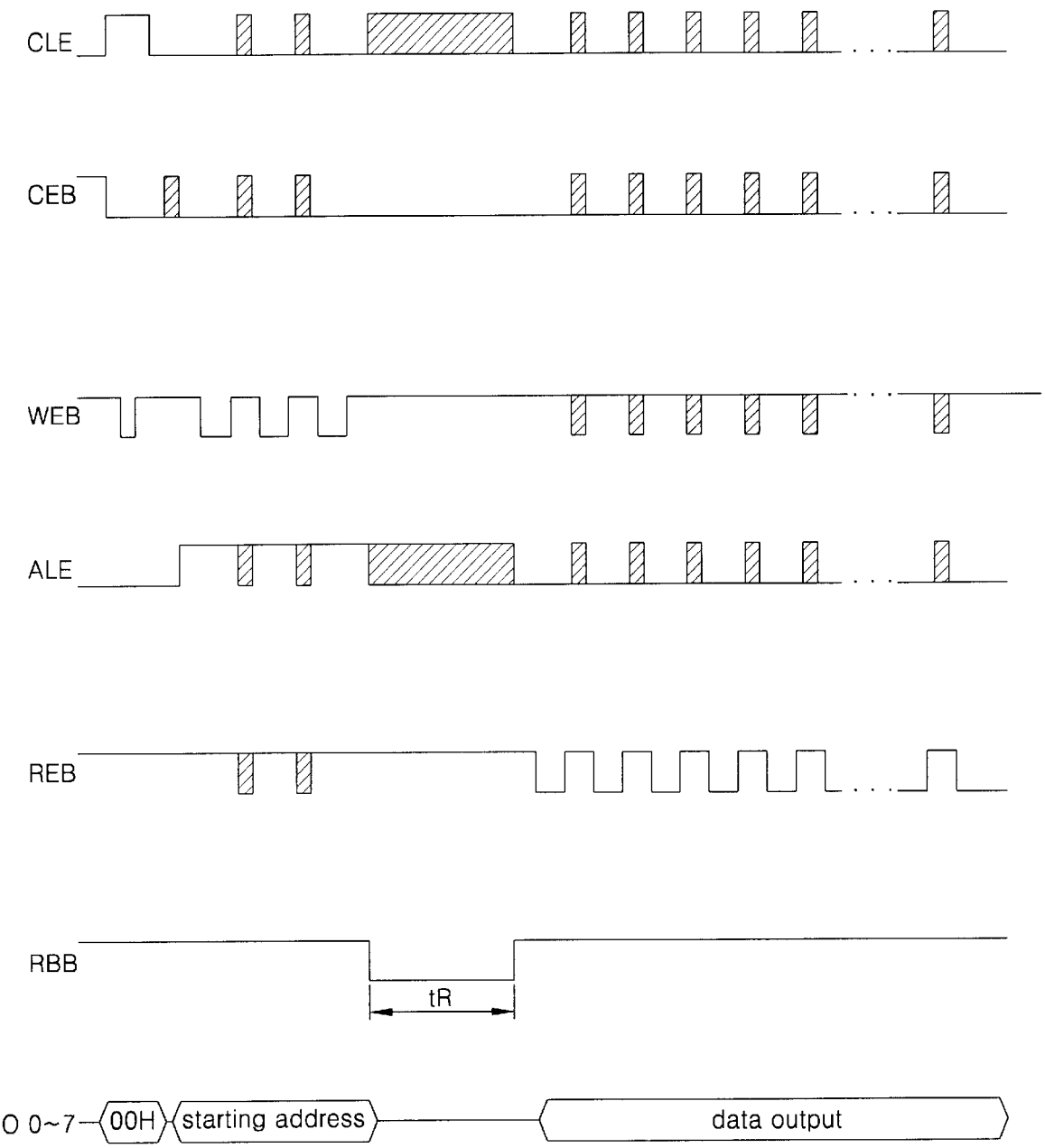
FIG. 5 is a timing diagram illustrating a read operation of the nonvolatile memory 20-1, when controlled by the circuit of FIG. 3.

As shown in FIG. 6, circuit 79 includes a number of components similar to those shown in FIG. 3. These include a CEB buffer 60, a WEB disable detecting circuit 62, a REB disable detecting circuit 64, a program command detecting circuit 66, an erase command detecting circuit 68, a read command detecting circuit 70, a PGM DNT signal generating circuit 72, a ERS DNT signal generating circuit 74, and a RBB ready detecting circuit 78.

The circuit 79 further includes an address input end detecting circuit 80, a first RD DNTA signal generating circuit 82, a second RD DNTB enable/disable detecting circuit 84, a NOR gate NOR2, a NAND gate NAND2, and an inverter I2.

An operation of these components is now described. First, the components that are similar to those in FIG. 3 operate as described above. In addition, the address input end detecting circuit 80 generates an address input end detecting signal AEND when an input of an address is completed.

Importantly, the first RD DNTA signal generating circuit 82 is not the same as circuit 76 of FIG. 3. Circuit 82 generates a first read "don't care" signal RD DNTA having a logic "high" level when the read command detecting signal, the WEB disable detecting signal and the REB disable detecting signal are generated. But the first signal RD DNTA does not necessarily have a logic "low" level in response to the RBB signal.

In addition, the second RD DNTB enable/disable detecting circuit 84 enables a second read "don't care" signal RD DNTB when the address input end detecting signal AEND is generated, and disables it when the ready detecting signal RBB is generated from circuit 78. In other words, the second read "don't care" detecting signal RD DNTB transits to a logic "high" level in response to the address input end detecting signal AEND, and transits to a logic "low" level in response to the ready detecting signal.

The NOR gate NOR2 generates a signal having a logic "low" level when the read "don't care" signal RD DNTA having a logic "high" level is generated. The NAND gate NAND2 and the inverter I2 generate an internal inverted chip enable signal CEiB in response to an output signal of a logic "low" level of the NOR gate NOR2. It will be appreciated that the internal inverted chip enable signal CeiB generated by circuit 79 is different from that generated by circuit 59 of FIG. 3.

The inverted chip enable signal generating circuit 79 of FIG. 6 can generate the internal inverted chip enable signal CEiB of a logic "low" level during a first busy period tR of a read operation, regardless of the state of the external inverted chip enable signal CEB. Therefore, it is possible to operate the other nonvolatile memories 20-2 to 20-n of the chip during the first busy period tR11 of the first nonvolatile memory 20-1.

Figure 7:
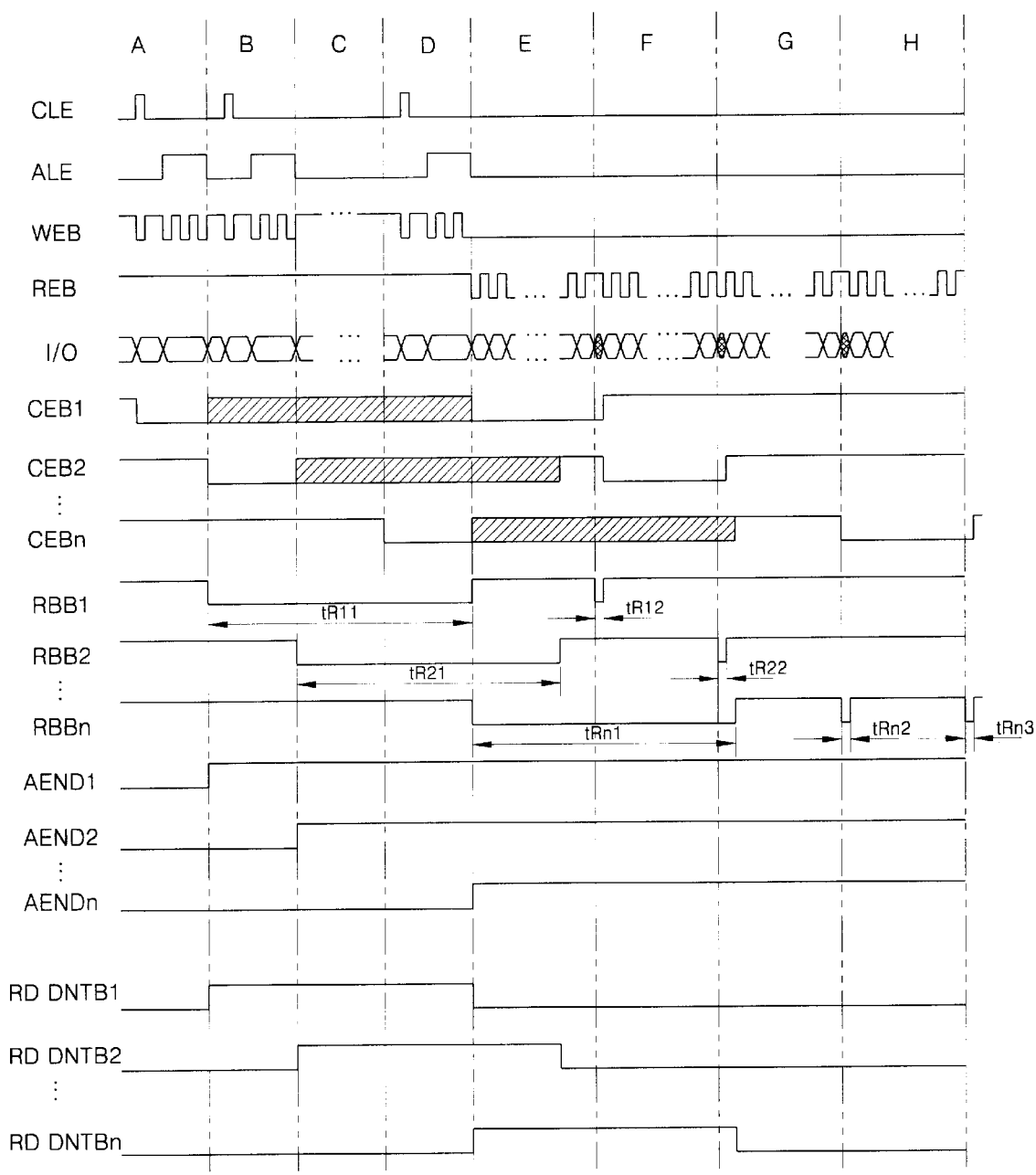
FIG. 7 is a timing diagram illustrating a read interleaving operation of a system having a plurality of the nonvolatile memories according to a first preferred embodiment of the present invention.

FIG. 7 is a timing diagram illustrating a read interleaving operation of a system having a plurality of the nonvolatile memories according to a first preferred embodiment of the present invention. The operation is shown in time intervals A–H. Time intervals A–H are demarcated according to importance, and therefore do not necessarily share the same time scale.

It will be appreciated how, in each of the nonvolatile memories 20-1 to 20-n, the ready detecting signals RBB1 to RBBn show the first and subsequent busy periods tR. Due to the differing time scale, however, the second busy periods tR12 to tRn2 are shown shorter than the busy periods tR11 to tRn1, while in fact they have the same duration.

It will also be appreciated how the ready detecting signals RBB1 to RBBn cooperate with the respective address input end detecting signals AEND1 to AENDn to generate the second read "don't care" signals RD DNTB1 to RD DNTBn.

Figure 1:
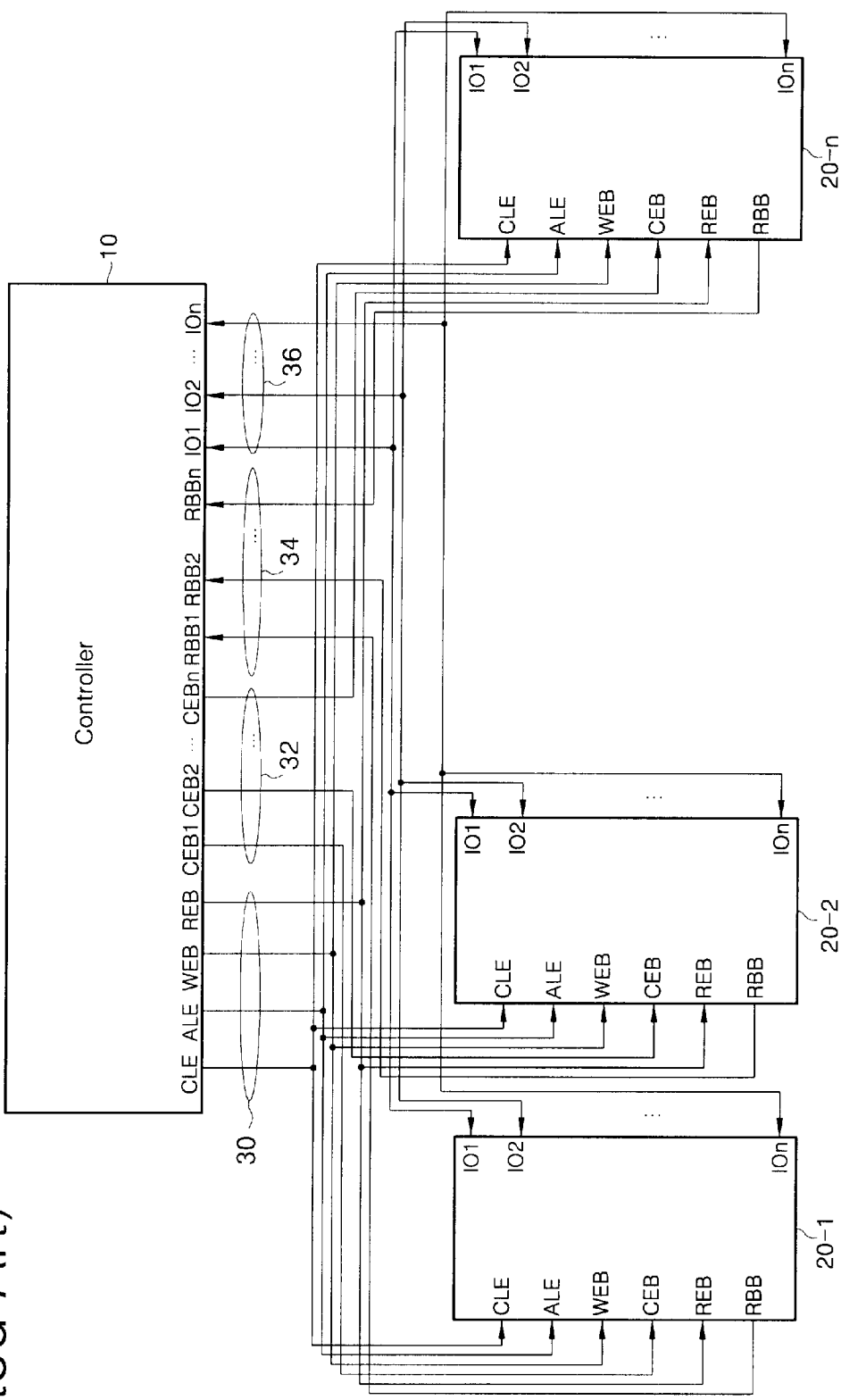
FIG. 1 is a block diagram illustrating a system having a plurality of the nonvolatile memories according to a prior art.
Figure 8:
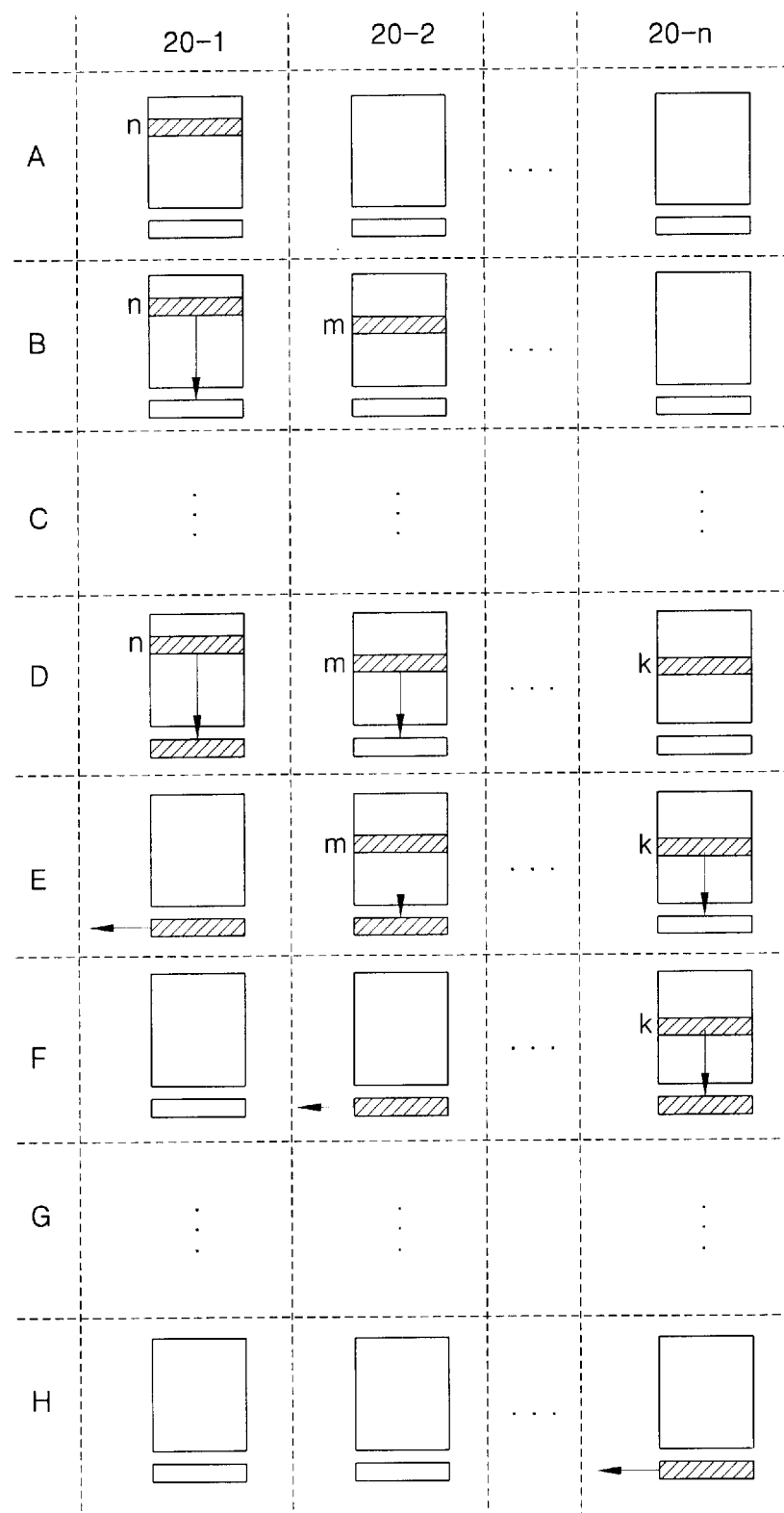
FIG. 8 shows snapshots of the nonvolatile memories 20-1 to 20-n during each interval of the timing diagram of FIG. 7.

Referring now also to FIG. 8, a read interleaving operation of a system according to the first preferred embodiment of the present invention is described. The system has n nonvolatile memories, such as memories 20-1 to 20-n of FIG. 1. FIG. 8 shows snapshots of these nonvolatile memories 20-1 to 20-n during the intervals A–H of the timing diagram of FIG. 7. In FIG. 8, each box in dotted lines shows a large block representing the memory cell array and a small box representing the corresponding buffer.

During a first interval A, when the controller 10 (see FIG. 1) generates the external inverted chip enable signal CEB1 having a logic "low" level, an operation of the nonvolatile memory 20-1 is enabled. Further, when an address is applied, the nonvolatile memory 20-1 is ready for a read operation. The nonvolatile memory 20-1 detects the address input end, and then outputs the ready/busy signal RBB1 of a logic "low" level to the controller 10. Simultaneously it generates the address input end detecting signal AEND1 of a logic "high" level. At this time, the nonvolatile memory 20-1 enters a "don't care" state, due to the address input end detecting signal AEND1 going to a logic "high" level.

During a second interval B, when the controller 10 generates the external inverted chip enable signal CEB2 of a logic "low" level, an operation of the nonvolatile memory 20-2 is enabled. When a command and an address are applied, the nonvolatile memory 20-2 is ready for a read operation. The nonvolatile memory 20-1 performs its internal operation regardless of a logic state of the applied external inverted chip enable signal CEB 1. Plus, it continues to output the ready/busy signal RBB1 of a logic "low" level to the controller 10. As shown in FIG. 8, data of an nth page that is stored in the memory cell array of the nonvolatile memory 20-1 are transferred to the corresponding individual page buffer. At the same time, data of an mth page of the memory cell array of the nonvolatile memory 20-2 are being accessed.

During a third interval C, in the same way as the second interval B, data access operation of corresponding page of the nonvolatile memories 20-3 to 20-(n–1) and data transfer operation from memory cell array to page buffer are performed.

During a fourth interval D, data of a kth page of the nonvolatile memory 20-n are accessed. When data of a nth page of the memory cell array of the nonvolatile memory 20-1 are all transferred to the page buffer, the ready/busy signal RBB1 of a logic "high" level is generated. This is because a sufficient time can be provided to input a command and an address for other nonvolatile memories during a busy period tR. The time can be provided if it is assumed that a busy period for a data transmission from the memory cell array to the page buffer is a time of tens of microseconds, since a period of inputting a command and an address is much shorter, lasting just tens of nanoseconds.

The nonvolatile memories 20-1 to 20-n can thus be operated regardless of the received external inverted chip enable signals CEB1 to CEBn. This is due to the read "don't care" signals RD DNTB1 to RD DNTBn that are generated during their first busy periods tR11 to tRn1.

During a fifth interval E, the inverted read enable signal REB is applied from the controller 10. In response, data that are stored in the page buffer of the nonvolatile memory 20-1 are outputted in byte unit. Plus, a transmission of data of an n-page that are stored in the memory cell arrays is ended. Moreover, data of a kth page that are stored in the memory cell array of the nonvolatile memory 20-n begin to be transferred to the page buffer.

During a sixth interval F, data that are stored in the page buffer of the nonvolatile memory 20-2 are transferred in byte unit to an external portion.

During a seventh interval (R data that are stored in the page buffer of the nonvolatile memories 20-3 to 20-(n–1) are sequentially transferred in byte unit to an external portion.

During a eighth interval H, data that are stored in the page buffer of the nonvolatile memory 20-n are transferred in byte unit to an external portion.

As can be seen, the invention enables a system can perform a data read operation by interleaving a plurality of the nonvolatile memories 20-1 to 20-n. Since it is impossible to set a "don't care" interval during the busy period tR12 to tRn2, the timing diagram of FIG. 7 shows that a read operation can be sequentially performed by keeping the inverted chip enable signal CEB at a logic "low" level during a predetermined time of the busy time periods of tR12 to tRn2.

Figure 9:
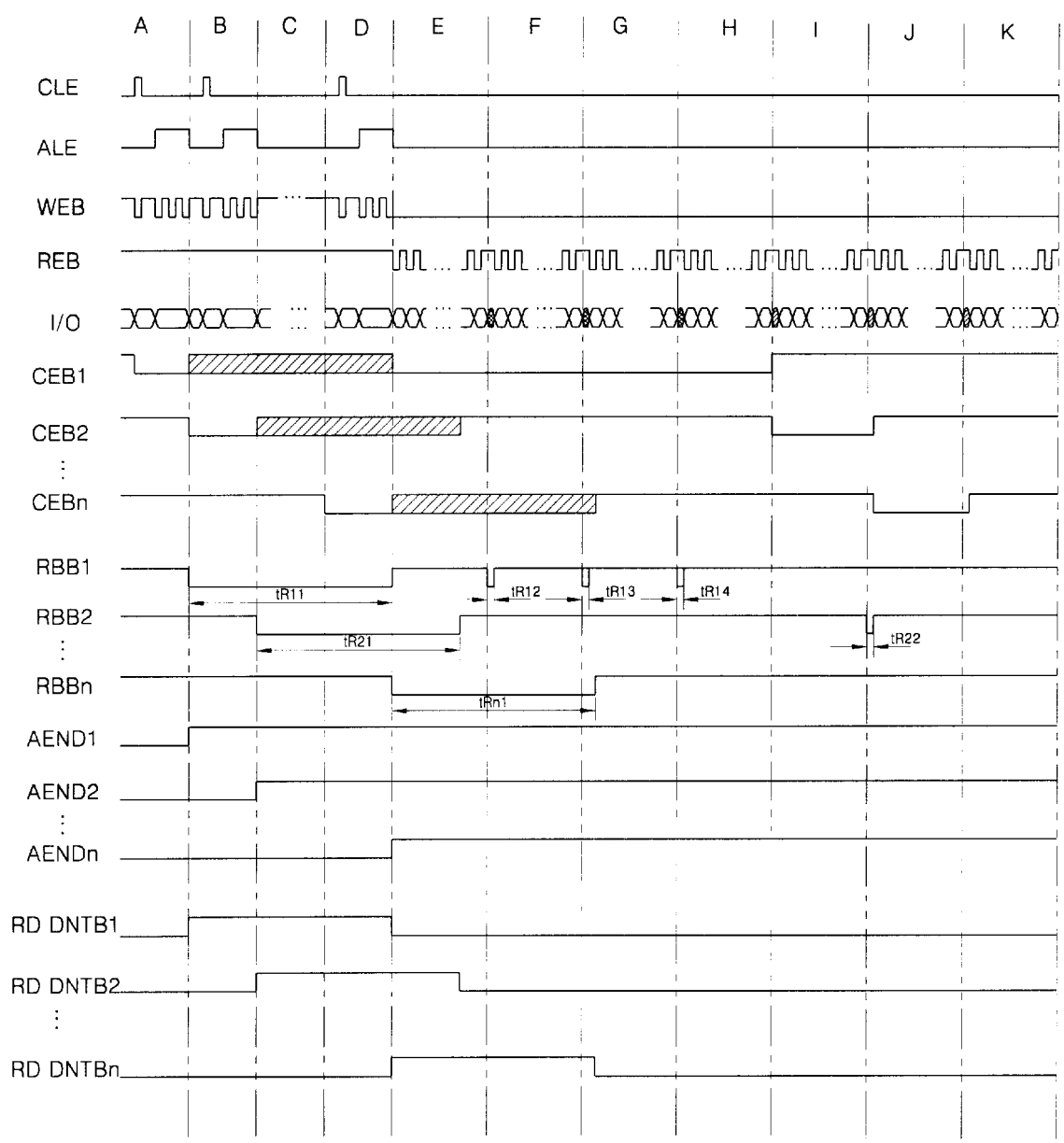
FIG. 9 is a timing diagram illustrating a read interleaving operation of a system having a plurality of the nonvolatile memories according to a second preferred embodiment of the present invention.

FIG. 9 is a timing diagram illustrating a read interleaving operation of a system having a plurality of the nonvolatile memories according to a second preferred embodiment of the present invention. The operation is shown demarcated in time intervals A–K, which do not necessarily share the same time scale. For example, the busy periods tR12 to tRn2 are shown shorter than the busy periods tR11 to tRn1, while in fact they have the same duration.

Figure 10A:
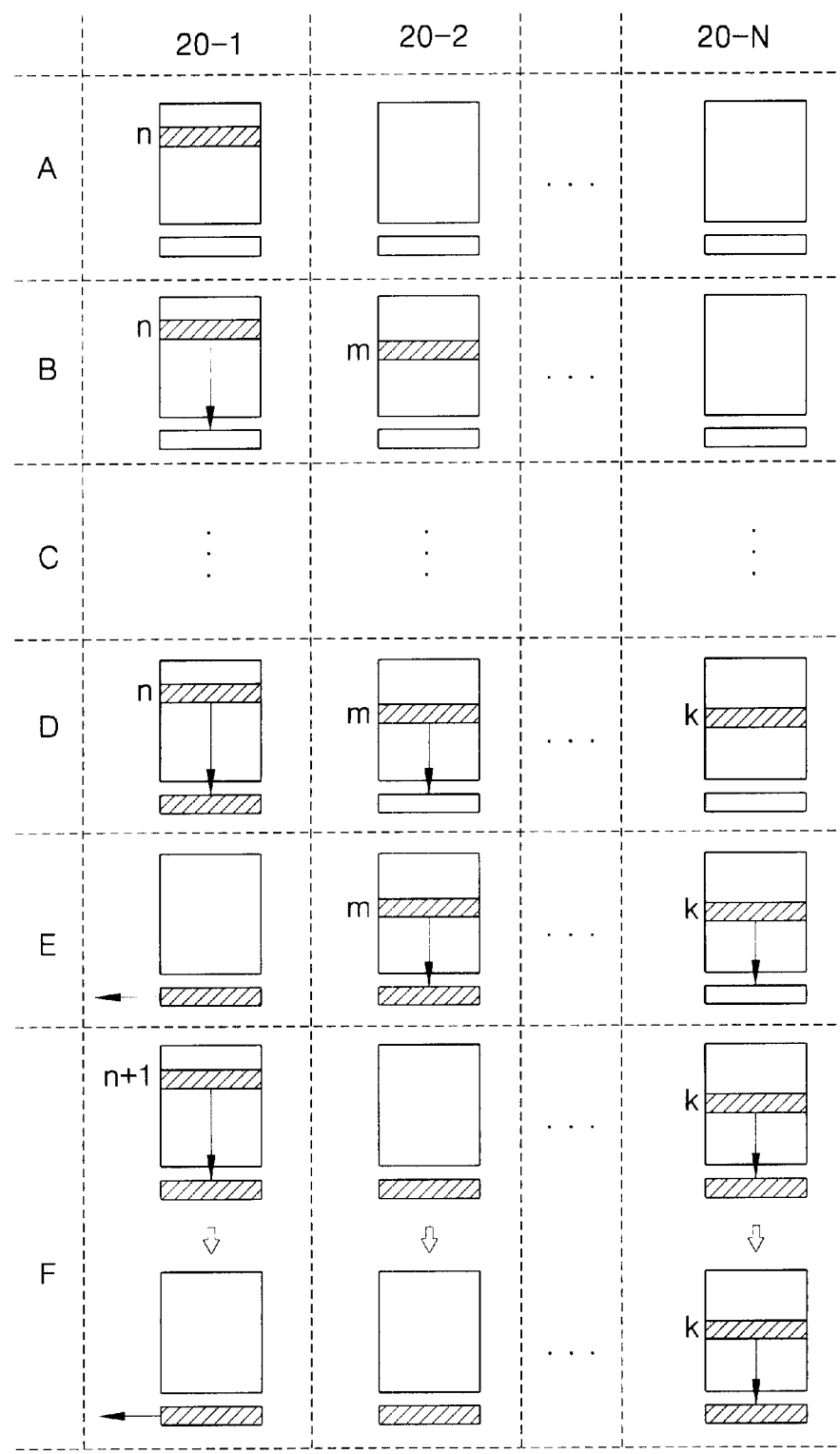
FIG. 10a and FIG. 10b, taken together, show snapshots of the nonvolatile memories 20-1 to 20-n according to each interval of the timing diagram of FIG. 9.
Figure 10B:
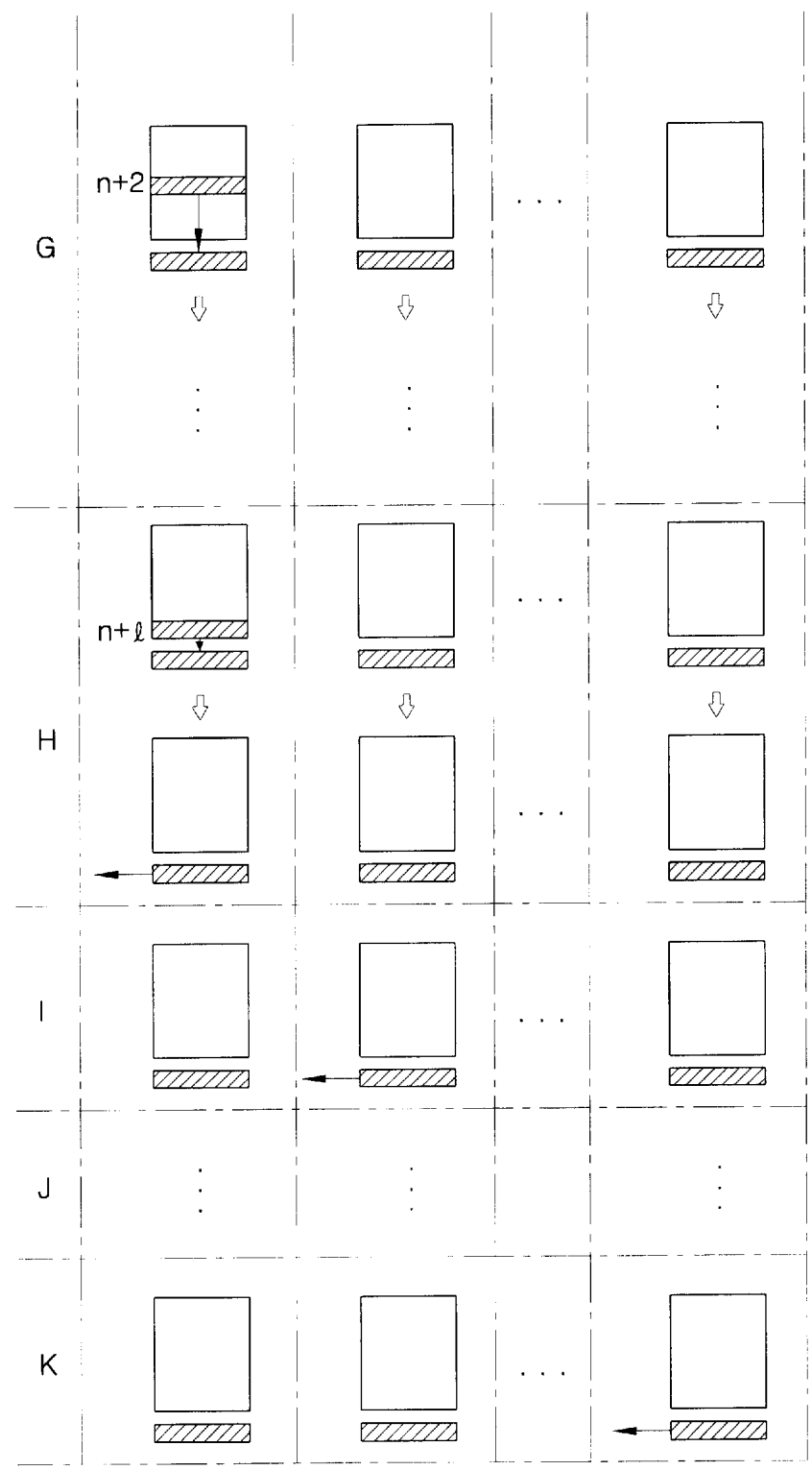

Referring now also to FIG. 10a and FIG. 10b, an operation of a system according to the second preferred embodiment of the present invention is described. The system has n nonvolatile memories, such as memories 20-1 to 20-n of FIG. 1. FIG. 10a and FIG. 10b show snapshots of these nonvolatile during the intervals A–K of the timing diagram of FIG. 9.

In intervals A–K, the nonvolatile memory 20-1 performs a sequential read operation, while the nonvolatile memories 20-2 to 20-n perform a read operation. Operations of a first interval A to a fifth interval E are the same as those of FIG. 7, and therefore their description will not be repeated.

During a sixth interval F to a eighth interval H, the controller 10 applies the external inverted chip enable signal CEB1 of a logic "low" level to the nonvolatile memory 20-1, and thus the nonvolatile memory 20-1 performs a sequential read operation. As shown in FIG. 10, since each interval shows an operation that is carried out inside of the nonvolatile memory 20-1, an operation during the sixth interval F to the eighth interval H will be understood with reference to FIG. 10. Data are read with increasing page by one page from an nth page.

During a ninth interval I, when the controller 10 applies the external inverted chip enable signal CEB2 of a logic "low" level to the nonvolatile memory 20-2, an operation of the nonvolatile memory 20-2 is enabled. When the external inverted chip enable signals CEB1, and CEB3 to CEBn of a logic "high" level are, respectively, applied to other nonvolatile memories, an operation of the other nonvolatile memories 20-1, and 20-3 to 20-n is disabled. As shown in FIG. 10, data of an mth page that are stored in the page buffer are outputted to an external portion.

During a tenth interval J, the controller 10 sequentially enables an operation of the nonvolatile memories next to the nonvolatile memory 20-2. Therefore, the nonvolatile memories next to the nonvolatile memory 20-2 sequentially output data of a page corresponding to the starting address that is applied from an external portion.

During an eleventh interval K, the controller 10 enables an operation of the nonvolatile memory 20-n and disables an operation of the other nonvolatile memories. Then, as shown in FIG. 10, the nonvolatile memory 20-n outputs data of a kth page that are stored in the page buffer of the nonvolatile memory 20-n.

As described above, the system having a plurality of the nonvolatile memories according to the second preferred embodiment of the present invention can operate a plurality of the nonvolatile memories by using the interleaving method with performing the sequential read operation and the CEB intercept operation "as is".

As described herein before, the nonvolatile memory according to the preferred embodiments of the present inventions performs its operation regardless of a logic state of the external inverted chip enable signal that is applied from an external portion during the first busy period.

Methods of the invention are now described. The methods are for reading data from a system having a plurality of nonvolatile memories.

As a first step, a first one of the nonvolatile memories is enabled. This may be performed by applying an external inverted chip enable signal CEB.

Then a first read command and a first starting address are applied to the enabled first memory. This ultimately causes the first memory to perform an internal read operation. The internal read operation may be performed during a first busy period.

Then a second read command and a second starting address are applied to at least a second one of the nonvolatile memories. This takes place while the first nonvolatile memory performs the internal read operation.

This is accomplished by preventing the first nonvolatile memory from going to a "don't care" state during a busy period after the first busy period. Then the remaining nonvolatile memories are read.

Preventing in the first memory while the first read command is applied is accomplished as follows:

A first read "don't care" signal is generated during a disable interval of an inverted write enable signal and a disable interval of an inverted read enable signal.

Then a second read "don't care" signal is generated, which is enabled by detecting an address input end, and disabled by detecting a ready state of a ready/busy signal. Then an internal inverted chip enable signal is enabled memory when at least one of the first and the second read "don't care" signals is generated, regardless of a logic state of the applied external inverted chip enable signal.

Further, the system having a plurality of the nonvolatile memories and the data read method of the system according to the preferred embodiments of the present invention can operate a plurality of the nonvolatile memories by using the interleaving method by allowing the other nonvolatile memories to go to a ready state while one nonvolatile memory performs an internal read operation during the first busy period, leading to an improved system performance.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A nonvolatile memory adapted to receive an external inverted chip enable signal and to generate an internal inverted chip enable signal, comprising:

a first read "don't care" signal generating means for generating a first read "don't care" signal during a disable interval of an inverted write enable signal and a disable interval of an inverted read enable signal when a read command is applied during a read operation;

a second read "don't care" signal generating means for generating a second read "don't care" signal, being enabled by detecting an address input end, and being disabled by detecting a ready state of a ready/busy signal when the read command is applied during the read operation; and an internal inverted chip enable signal controlling means for enabling the internal inverted chip enable signal when at least one of the first and the second read "don't care" signals is generated regardless of a logic state of the external inverted chip enable signal.

2. The memory of claim 1, wherin the first read "don't care" signal generating means includes:

a first detecting means for detecting a disable of the inverted write enable signal;

a second detecting means for detecting a disable of the inverted read enable signal;

a third detecting means for detecting the read command and generating a read command detecting signal; and a first read "don't care" signal generating circuit for generating the first read "don't care" signal in response to output signals of the first and second detecting means when a third detecting signal is generated.

3. The memory of claim 1, wherein the second read "don't care" signal generating means includes:

a fouth detecting means for detecting an address input end;

a fifth detecting means for detecting a ready state of the ready/busy signal; and a second read "don't care" signal generating circuit for generating a second read "don't care" signal, the second read "don't care" signal enabled in response to an output signal of the fourth detecting means and disabled in response to an output signal of the fifth detecting means.

4. The memory of claim 1, wherein the internal inverted chip enable signal controlling means includes a NOR gate receiving the first read "don't care" signal and the second read "don't care" signal.

5. A system comprising:

a plurality of nonvolatile memories, each being adapted to generate a ready/busy signal and an internal inverted chip enable signal; and a controller for outputting to the memories an external inverted chip enable signal, an inverted write enable signal, an inverted read enable signal, an address, and data, and for inputting the ready/busy signals outputted from the nonvolatile memories, wherein each of the nonvolatile memories includes a first circuit for generating a first read "don't care" signal during a disable interval of the inverted write enable signal and a disable interval of the inverted read enable signal when a read command is applied during a read operation of each of the nonvolatile memories;

a second circuit for generating a second read "don't care" signal, which is enabled by detecting an address input end, and disabled by detecting a ready state of the ready/busy signal when the read command is applied during the read operation; and a third circuit for enabling an internal inverted chip enable signal when at least one of the first and the second read "don't care" signals is generated regardless of a signal logic state of the external inverted chip enable signal.

6. The system of claim 5, wherein the first circuit includes:

a first detecting means for detecting a disable of the inverted write enable signal;

a second detecting means for detecting a disable of the inverted read enable signal;

a third detecting means for detecting the read command to generate a read command detecting signal; and a first read "don't care" signal generating circuit for generating the first read "don't care" signal in response to output signals of the first and second detecting means when a third detecting signal is generated.

7. The system of claim 5, wherein the second circuit includes:

a fouth detecting means for detecting an address input end;

a fifth detecting means for detecting a ready state of the ready/busy signal; and a second read "don't care" signal generating circuit for generating a second read "don't care" signal, the second read "don't care" signal enabled in response to an output signal of the fourth detecting means and disabled in response to an output signal of the fifth detecting means.

8. The system of claim 5, wherein the third circuit includes a NOR gate receiving the first read "don't care" signal and the second read "don't care" signal.

9. A data read method of a system having a plurality of nonvolatile memories, the method comprising:

enabling a first one of the nonvolatile memories;

applying a first read command and a first starting address to the enabled first memory to cause the first memory to perform an internal read operation; and applying a second read command and a second starting address to a second one of the nonvolatile memories while the first nonvolatile memory performs the internal read operation.

10. The method of claim 9, wherein enabling is performed by applying an external inverted chip enable signal, and further comprising:

generating in the first memory a first read "don't care" signal during a disable interval of an inverted write enable signal and a disable interval of an inverted read enable signal while the first read command is applied;

generating in the first memory a second read "don't care" signal, being enabled by detecting an address input end, and being disabled by detecting a ready state of a ready/busy signal while the first read command is applied; and enabling in the first memory an internal inverted chip enable signal when at least one of the first and the second read "don't care" signals is generated, regardless of a logic state of the applied external inverted chip enable signal.

11. The method of claim 9, wherein the internal read operation is performed during a first busy period, and further comprising:

preventing the first nonvolatile memory from going to a "don't care" state during a busy period after the first busy period.

12. The method of claim 11, further comprising:

perfoming sequentially the read operation in a third one of the nonvolatile memories.

* * * * *